United States Patent
Yoo et al.

(10) Patent No.: US 10,700,193 B2
(45) Date of Patent: Jun. 30, 2020

(54) POWER DEVICE

(71) Applicant: Samsung Electronics Co., Ltd., Suwon-si, Gyeonggi-do (KR)

(72) Inventors: Jae-hyun Yoo, Suwon-si (KR); Ui-hui Kwon, Hwaseong-si (KR); Da-won Jeong, Hwaseong-si (KR); Jae-ho Kim, Seoul (KR); Jun-hyeok Kim, Incheon (KR); Kang-hyun Baek, Seoul (KR); Kyu-ok Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/414,186

(22) Filed: May 16, 2019

(65) Prior Publication Data

US 2020/0144411 A1  May 7, 2020

(30) Foreign Application Priority Data

Nov. 1, 2018  (KR) ........................ 10-2018-0133134

(51) Int. Cl.
*H01L 29/78* (2006.01)
*H01L 29/10* (2006.01)
(Continued)

(52) U.S. Cl.
CPC ...... *H01L 29/7809* (2013.01); *H01L 29/0653* (2013.01); *H01L 29/1095* (2013.01);
(Continued)

(58) Field of Classification Search
None
See application file for complete search history.

(56) References Cited

U.S. PATENT DOCUMENTS 6,867,476 B2   3/2005  Lee
7,663,186 B2   2/2010  Ono et al.
(Continued)

FOREIGN PATENT DOCUMENTS

JP   2009-070849 A    4/2009
JP   2009-259861 A   11/2009

OTHER PUBLICATIONS

Noel Berkovitch et al., "Integrated 60V Vertical DMOS on 0.18um platform for Power over Ethernet IC" Communications, Antennas and Electronic Systems (COMCAS 2013), Tel Aviv, Israel, Oct. 21-23, 2013.

*Primary Examiner* — Thien F Tran
(74) *Attorney, Agent, or Firm* — Harness, Dickey and Pierce, P.L.C.

(57) ABSTRACT

A power device includes a drift layer of a second conductivity type located on a semiconductor layer of a first conductivity type, a first source region of the second conductivity type and a second source region of the second conductivity type, located on the drift layer to be apart from each other, and a gate electrode on the drift layer between the first and second source regions with a gate insulating layer between the gate electrode and the drift layer, wherein the gate electrode includes a first gate electrode and a second gate electrode adjacent to the first source region and the second source region, respectively, and a third gate electrode between the first and second gate electrodes, wherein the third gate electrode is floated or grounded.

20 Claims, 12 Drawing Sheets

(51) Int. Cl.
  *H01L 29/423* (2006.01)
  *H01L 29/40* (2006.01)
  *H01L 29/06* (2006.01)

(52) U.S. Cl.
  CPC ...... *H01L 29/402* (2013.01); *H01L 29/42364* (2013.01); *H01L 29/42376* (2013.01)

(56) References Cited

U.S. PATENT DOCUMENTS

| | | |
|---|---|---|
| 8,921,173 B2 | 12/2014 | Levin et al. |
| 8,952,391 B2 | 2/2015 | Harada et al. |
| 9,537,002 B2 | 1/2017 | Harada et al. |
| 2004/0079989 A1* | 4/2004 | Kaneko ................ H01L 29/165 257/328 |
| 2006/0124994 A1* | 6/2006 | Jang .................... H01L 29/7805 257/328 |
| 2009/0179273 A1 | 7/2009 | Komachi |
| 2011/0101374 A1* | 5/2011 | Ryu .................. H01L 29/66068 257/77 |

* cited by examiner

POWER DEVICE

CROSS-REFERENCE TO RELATED APPLICATION

This application claims the benefit of Korean Patent Application No. 10-2018-0133134, filed on Nov. 1, 2018, in the Korean Intellectual Property Office, the disclosure of which is incorporated herein in its entirety by reference.

BACKGROUND

Example embodiments of the inventive concepts relate to a power device. For example, at least some example embodiments relate to a power device including a vertical double diffused metal oxide semiconductor (VDMOS) transistor.

A power device may include a VDMOS transistor, which is easily manufactured and has excellent electrical characteristics. When designing the power device including the VDMOS transistor, to improve driving currents and reduce (or, alternatively, minimize) driving power consumption, it may be desirable to maintain a high breakdown voltage and reduce (or alternatively, minimize) a specific on resistance and a parasitic capacitance, to n.

However, a breakdown voltage characteristic, a specific on resistance characteristic, and a parasitic capacitance characteristic have trade-off relationships. Therefore, to improve the driving currents and reduce (or, alternatively, minimize) the driving power consumption it may be desirable to improve (or, alternatively, optimize) the breakdown voltage characteristic, the specific on resistance characteristic, and the parasitic capacitance characteristic, requested for the power device.

SUMMARY

Example embodiments of the inventive concepts provide a power device including a vertical double diffused metal oxide semiconductor (VDMOS) transistor, which is capable of improving driving currents and reducing (or, alternatively, minimizing) driving power consumption by improving (or, alternatively, optimizing) a breakdown voltage characteristic, a specific on resistance characteristic, and a parasitic capacitance characteristic.

According to an example embodiment of the inventive concepts, a power device may include: a semiconductor layer of a first conductivity type; a drift layer of a second conductivity type on the semiconductor layer; a plurality of source regions on the drift layer, the plurality of source regions including a first source region and a second source region apart from the first source region on the drift layer, the first source region and the second source region each of the second conductivity type; and a plurality of gate electrodes between the first source region and the second source region and apart from the drift layer by a gate insulating layer, the plurality of gate electrodes including a first gate electrode, a second gate electrode and a third gate electrode, the first gate electrode adjacent to the first source region, the second gate electrode adjacent to the second source region, and the third gate electrode between the first and second gate electrodes, the third gate electrode being floated or grounded.

According to another example embodiment of the inventive concepts, a power device may include: a semiconductor layer of a first conductivity type; a buried layer of a second conductivity type on the semiconductor layer, the buried layer included in a drain region of the power device; a drift layer of the second conductivity type on the buried layer, the drift layer defined by a trench device isolation layer; a drain electrode penetrating the trench device isolation layer such that the drain electrode is connected to the buried layer; a plurality of source body regions in the drift layer, the plurality of source body regions of the first conductivity type and including a first source body region and a second source body region apart from the first source body region; a plurality of source regions on respective ones of the plurality of source body regions, the plurality of source regions of the second conductivity type and including a first source region and a second source region on surfaces of the first source body region and the second source body region, respectively; a plurality of source electrodes including a first source electrode and a second source electrode on the first source region and the second source region, respectively; and a plurality of gate electrodes between the first source region and the second source region and apart from the drift layer by a gate insulating layer, the plurality of gate electrodes including a first gate electrode, a second gate electrode and a third gate electrode, the first gate electrode and the second gate electrode over a first side and a second side of the drift layer, respectively, and the third gate electrode over a central portion of the drift layer, the third gate electrode being floated or grounded.

According to another example embodiment of the inventive concepts, a power device may include: a semiconductor layer of a first conductivity type; a buried layer of a second conductivity type located on the semiconductor layer, the buried layer included in a drain region of the power device; a drift layer of the second conductivity type on the buried layer, the drift layer defined by a trench device isolation layer; a drain electrode penetrating the trench device isolation layer such that the drain electrode is connected to the buried layer; a plurality of source body regions in the drift layer, the plurality of source body regions of the first conductivity type and including a first source body region and a second source body region apart from the first source body region; a plurality of source regions on respective ones of the plurality of source body regions, the plurality of source regions of the second conductivity type and including a first source region and a second source region on surfaces of the first source body region and the second source body region, respectively; a plurality of source electrodes including a first source electrode and a second source electrode on the first source region and the second source region, respectively; and a plurality of gate electrodes between the first source region and the second source region and apart from the drift layer by a gate insulating layer, the plurality of gate electrodes including a first gate electrode, a second gate electrode, and a third gate electrode, the first gate electrode and the second gate electrode adjacent to the first source region and the second source region, respectively, and the third gate electrode between the first gate electrode and the second gate electrode, the third gate electrode including a plurality of sub-gate electrodes apart from one another, the plurality of sub-gate electrodes being floated or grounded.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments of the inventive concepts will be described in detail by referring to the accompanying drawings. Example embodiments of the inventive concepts may be realized as any one example embodiment or may be realized as a combination of one or more example embodiments. Thus, example embodiments of the inventive concepts should not be construed as limited to any one example embodiment.

A power device according to example embodiments of the inventive concepts may include both a control function and a driver function and may be referred to as a smart power device. The power device may operate via a high voltage, for example, 80V through 200V. The power device according to example embodiments of the inventive concepts may include a vertical double diffused metal oxide semiconductor (VDMOS) transistor, which is easily manufactured and has excellent electrical characteristics.

When designing the power device including the VDMOS transistor, driving current may be improved by maintaining a high breakdown voltage BV and reducing (or, alternatively, minimizing) a specific on resistance Ron, sp and a parasitic capacitance.

A breakdown voltage characteristic may be an important factor for stability of the power device. A specific on resistance characteristic and a parasitic capacitance characteristic may be important factors for an operation characteristic of the power device, for example, a driving current capacity and power efficiency.

The breakdown voltage characteristic, the specific on resistance characteristic, and the parasitic capacitance characteristic have a trade-off relationship, and thus, the breakdown voltage characteristic, the specific on resistance characteristic, and the parasitic capacitance characteristic may be improved (or, alternatively, optimized) via the configurations to be described according to example embodiments hereinafter, in order to improve the driving current and the power efficiency.

In this specification, the expressions, such as "first" and "second," are used to distinguish members and are not used to limit the members or denote specific orders. Also, when a component is described as being located "on," "above," "below," or "at a side" of another component, it denotes a relative location relationship and does not define a specific case in which the component directly contacts the other component or another component is further inserted between the component and the other component. Also, when a component is described as "being connected to" or "being in contact with" another component, the component may be directly electrically or mechanically connected to or in contact with the other component, or may be electrically or mechanically connected to or in contact with the other component with other components interposed therebetween.

Figure 1:
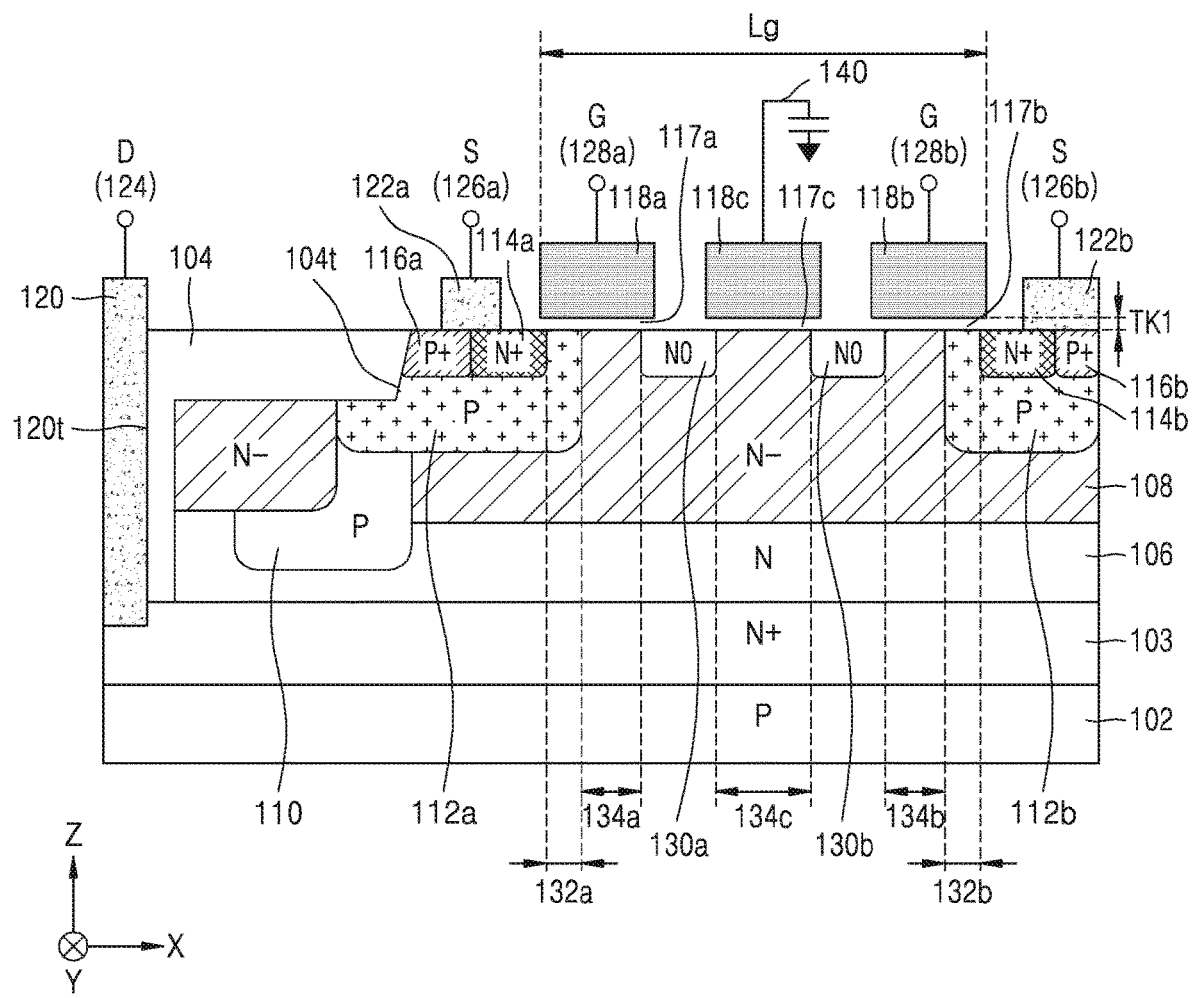
FIG. 1 is a cross-sectional view of a power device according to an example embodiment of the inventive concepts.

FIG. 1 is a cross-sectional view of a power device 10 according to an example embodiment of the inventive concepts.

In detail, the power device 10 may be a VDMOS transistor. The power device 10 may be a high voltage integrated device operating via a high voltage. The power device 10 may include a semiconductor layer 102 of a first conductivity type, that is, a p-conductivity type. In the detailed description, for convenience of explanation, the first conductivity type may denote a p-conductivity type and a second conductivity type may denote an n-conductivity type, which is the opposite to the first conductivity type.

The semiconductor layer 102 may include a substrate doped with the p-conductivity type, for example, Boron (B). The substrate may include a silicon substrate or a silicon wafer. The semiconductor layer 102 may be a p-conductivity type impurity region or a p-conductivity type diffusion region arranged in a substrate. The semiconductor layer 102 may include an epitaxial layer epitaxially grown on a substrate. The semiconductor layer 102 may have an active region. The active region may be defined by a trench device isolation layer 104. The trench device isolation layer 104 may include an insulating layer in a shallow trench 104t.

A buried layer 103 of a second conductivity type, that is, an n-conductivity type, may be formed on the semiconductor layer 102 of the first conductivity type. The buried layer 103 may be a buried region. The buried layer 103 may be an N+ region doped with highly concentrated n-type impurities. The buried layer 103 may be a region doped with n-type impurities, for example, Phosphorus (P), in a concentration of $10E19/cm^3$ through $10E20/cm^3$. The buried layer 103 may be formed by injecting n-type impurities by using an ion injection method. The buried layer 103 may be included in a drain region.

The buried layer 103 may be connected to a drain electrode 120 filled in a deep trench 120t formed by etching the trench device isolation layer 104. In other words, the drain electrode 120 may be filled in the deep trench 120t penetrating the trench device isolation layer 104 and connected to the buried layer 103. The drain electrode 120 may include a metal layer. The drain electrode 120 may be connected to a drain terminal D (124).

An epitaxial layer 106 of a second conductivity type, that is, an n-conductivity type, may be formed on the buried layer 103. The epitaxial layer 106 may include an epitaxial layer epitaxially grown on the buried layer 103. The epitaxial layer 106 may be a region doped with n-type impurities, for example, P, in a concentration of $10E15/cm^3$.

A drift layer 108 of a second conductivity type, that is, an n-conductivity type, may be located on the epitaxial layer 106. The drift layer 108 may be defined on the semiconductor layer 102 by the trench device isolation layer 104. The drift layer 108 may be formed on the epitaxial layer 106. The drift layer 108 may be an n-type impurity region doped with n-type impurities. The drift layer 108 may be a region doped with n-type impurities, for example, P, in a concentration of $10E17/cm^3$. The drift layer 108 may be formed by injecting n-type impurities by using an ion injection method. The epitaxial layer 106 and the drift layer 108 may be broadly referred to as the overall drift layer.

First and second source body regions 112a and 112b of a first conductivity type, that is a p-conductivity type, may be located at an upper portion of the drift layer 108 to be apart from each other. The first and second source body regions 112a and 112b may be regions doped with p-type impurities, for example, B, in a concentration greater than $10E17/cm^3$ and less than $10E18/cm^3$. The first and second source body regions 112a and 112b may be formed by injecting p-type impurities by using an ion injection method.

A well region 110 of a first conductivity type may be located below the first source body region 112a below the trench device isolation layer 104. Carriers, for example, electrons, may move well through the drift layer 108 due to the well region 110. The well region 110 may be a region doped with p-type impurities, such as B, in a concentration of $10E16/cm^3$. The well region 110 may be formed by injecting p-type impurities by using an ion injection method.

First and second source regions 114a and 114b of a second conductivity type may be located on surfaces in the first and second source body regions 112a and 112b, respectively. The first and second source regions 114a and 114b may be n+ impurity regions. The first and second source regions 114a and 114b may be regions doped with n-type impurities, such as P, in a concentration of $10E19/cm^3$ through $10E20/cm^3$. The first and second source regions 114a and 114b may be formed by injecting n-type impurities by using an ion injection method.

First and second source body contact regions 116a and 116b of a first conductivity type may be located in the first and second source body regions 112a and 112b, respectively, to be adjacent to the first and second source regions 114a and 114b. The first and second source body contact regions 116a and 116b may be p+ impurity regions. The first and second source body contact regions 116a and 116b may be regions doped with p-type impurities, for example, B, in a concentration of $10E19/cm^3$ through $10E20/cm^3$. The first and second source body contact regions 116a and 116b may be formed by injecting p-type impurities by using an ion injection method.

A first source electrode 122a may be formed on the first source body contact region 116a and the first source region 114a. A first source terminal S (126a) may be connected to the first source electrode 122a. The first source terminal S (126a) may be commonly connected to the first source body contact region 116a and the first source region 114a.

A second source electrode 122b may be formed on the second source body contact region 116b and the second source region 114b. A second source terminal S (126b) may be connected to the second source electrode 122b. The second source terminal S (126b) may be commonly connected to the second source body contact region 116b and the second source region 114b.

Gate electrodes 118a, 118b, and 118c may be arranged above the drift layer 108 between the first source region 114a and the second source region 114b with gate insulating layers 117a, 117b, and 117c between the gate electrodes 118a, 118b, and 118c and the drift layer 108. The gate insulating layers 117a, 117b, and 117c may have the same thickness TK1. The gate electrodes 118a, 118b, and 118c may be formed above the drift layer 108 to be apart from one another. The gate electrodes 118a, 118b, and 118c may include a first gate electrode 118a and a second gate electrode 118b adjacent to the first source region 114a and the second source region 114b, respectively, and a third gate electrode 118c formed between the first and second gate electrodes 118a and 118b.

The first gate electrode 118a may be connected to a first gate terminal G (128a). The second gate electrode 118b may be connected to a second gate terminal G (128b). The third gate electrode 118c may be a floating electrode floated by being connected to a floating line 140. In terms of a device operation, a length Lg of the first through third gate electrodes 118a, 118b, and 118c may be a distance between an end of the first source region 114a and an end of the second source region 114b.

First and second impurity regions 130a and 130b of a second conductivity type may be formed on upper surfaces of the drift layer 108 between the first gate electrode 118a and the third gate electrode 118c and between the second gate electrode 118b and the third gate electrode 118c, with an impurity concentration higher than that of the drift layer 108.

The first and second impurity regions 130a and 130b may be NO impurity regions. The first and second impurity regions 130a and 130b may be regions doped with n-type impurities, such as P, in a concentration of $10E18/cm^3$. The first and second impurity regions 130a and 130b may be formed by injecting n-type impurities by using an ion injection method.

An upper portion of the first source body region 112a, adjacent to the first source region 114a, may be defined as a first channel region 132a. Below the first gate electrode 118a, the first channel region 132a may be formed in the first source body region 112a to be adjacent to the first source region 114a.

An upper portion of the second source body region 112b, adjacent to the second source region 114b, may be defined as a second channel region 132b. Below the second gate electrode 118b, the second channel region 132b may be formed in the second source body region 112b to be adjacent to the second source region 114b. The first channel region 132a and the second channel region 132b may form the overall channel regions. A length of the overall channel regions may be determined as a sum of a length of the first channel region 132a and a length of the second channel region 132b.

The drift layer 108 below the first gate electrode 118a between the first channel region 132a and the first impurity region 130a may be defined as a first drift region 134a. The first drift region 134a may be a region overlapping the first gate electrode 118a in a vertical direction (a Z direction).

The drift layer 108 below the second gate electrode 118b between the second channel region 132b and the second impurity region 130b may be defined as a second drift region 134b. The second drift region 134b may be a region overlapping the second gate electrode 118b in a vertical direction. The first drift region 134a and the second drift region 134b may be regions through which carriers, for example, electrons, move a lot, during device operation.

The drift layer 108 below the third gate electrode 118c between the first impurity region 130a and the second impurity region 130b may be defined as a third drift region 134c. The third drift region 134c may be a region overlapping the third gate electrode 118c in a vertical direction (a Z direction). The third drift region 134c may be a region through which the carriers, for example, the electrons, move less or do not move at all, during device operation, since the third gate electrode 118c is floated.

When a ground voltage, for example, 0V, is applied to the first and second source terminals S (126a) and S (126b), and a positive gate voltage (+Vg) and a positive drain voltage (+Vd) are applied to the first and second gate terminals G (128a) and G (128b) and the drain terminal D (124), respectively, the power device 10 is turned on. When the power device 10 turns on, an inversion layer may be formed in the first channel region 132a and the second channel region 132b. Carriers, for example, electrons, may move from the first and second source regions 114a and 114b to the buried layer 103 included in the drain region, through the inversion layer and the drift layer 108. Accordingly, currents may flow from the drain terminal D (124) to the first and second source terminals S (126a) and S (126b).

The power device 10 described above may have various effects as described below.

First, the power device 10 has a structure in which the drain electrode 120 filled in the deep trench 120t penetrating the trench device isolation layer 104 is connected to the buried layer 103, that is, the drain region. Based on this structural characteristic, example embodiments of the inventive concepts may be easily implemented in a bipolar-CMOS-DMOS (BCD) process. The BCD process may be a process in which a bipolar transistor, a CMOS (complementary metal-oxide-semiconductor) transistor, and a DMOS ((double-diffused metal-oxide-semiconductor, or, alternatively, a VDMOS (vertical diffused metal-oxide-semiconductor)) transistor are realized on the same substrate.

Second, the power device 10 may obtain a required breakdown voltage by adjusting a vertical thickness (a thickness in the Z direction) of the epitaxial layer 106 without increasing a horizontal area (an area of an X-Y plane) of the epitaxial layer 106 on the semiconductor layer 102. In other words, the power device 10 may adjust the breakdown voltage as a high voltage, for example, 80-200V, without being affected by the degree of integration, when the epitaxial layer 106 has a great thickness.

Third, the power device 10 may separate the gate electrode into a plurality of gate electrodes, that is, the first through third gate electrodes 118a, 118b, and 118c, so that an area in which the first through third gate electrodes 118a, 118b, and 118c and the drift layer 108 overlap each other on the X-Y plane may be decreased. In this case, the power device 10 may reduce a parasitic capacitance Cdg between the drain electrode 120 and the first through third gate electrodes 118a, 118b, and 118c, a parasitic capacitance Cds between the drain electrode 120 and the first and second source electrodes 122a and 122b, and a specific on resistance of the drift layer 108. Thus, the power device 10 may improve driving currents by improving the flow of the carriers, that is, the electrons, moving through the drift layer 108 in the vertical direction (the Z direction).

Fourth, the power device 10 may have the first and second impurity regions 130a and 130b of the second conductivity type formed on the upper surfaces of the drift layer 108 between the first gate electrode 118a and the third gate electrode 118c and between the second gate electrode 118b and the third gate electrode 118c, in a concentration greater than that of the drift layer 108. In this case, the specific on resistance of the drift layer 108 may be reduced to improve the driving currents. Also, a horizontal electric field (an electric field in the X direction) between the first source region 114a and the first impurity region 130a and a horizontal electric field (an electric field in a −X direction) between the second source region 114b and the second impurity region 130b may be increased to improve the flow of the carriers, that is, the electrons, moving through the first and second drift regions 134a and 134b in the vertical direction (the Z direction), so that the driving currents are improved.

Figure 2:
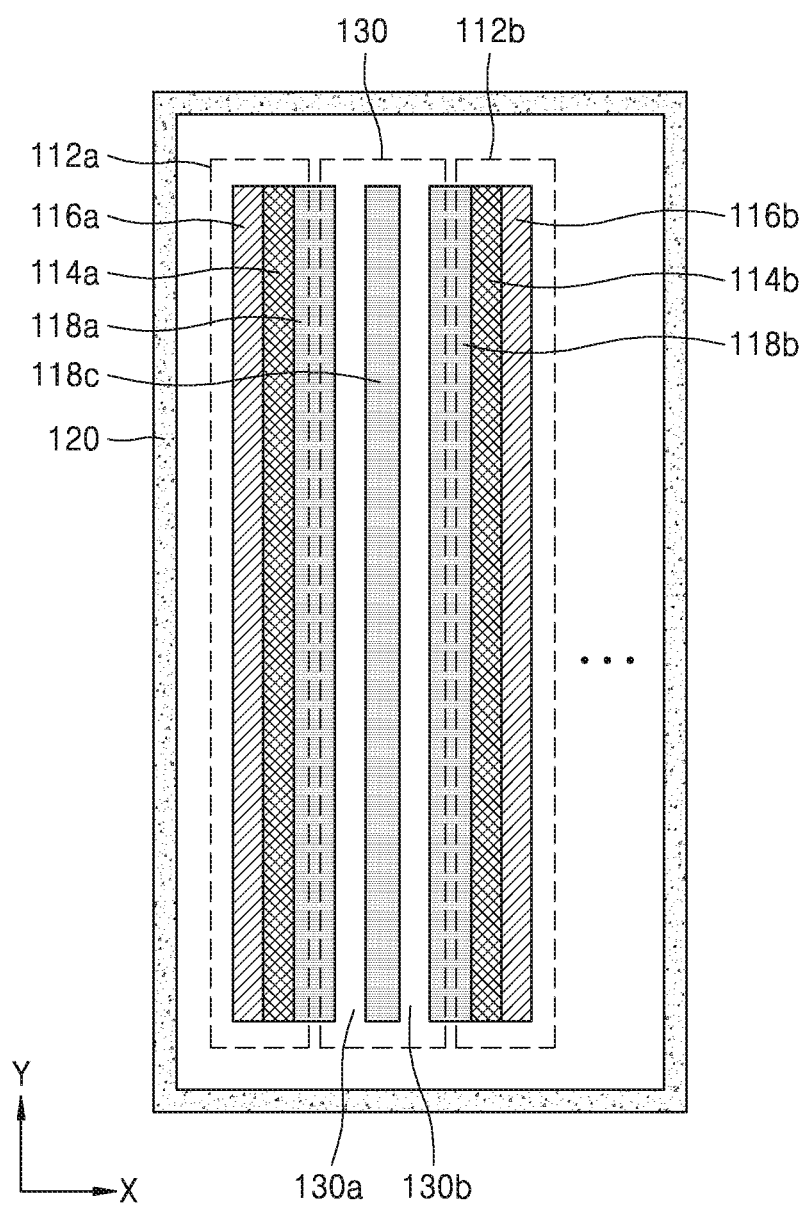
FIG. 2 is a view showing a planar layout of the power device of FIG. 1, according to an example embodiment.

FIG. 2 is a view showing a planar layout of the power device 10 of FIG. 1, according to an example embodiment.

In detail, FIG. 2 is the planar layout of some components of the power device 10 of FIG. 1. The power device 10 may include the first and second source body regions 112a and 112b, the first through third gate electrodes 118a, 118b, and 118c, and an impurity region 130 including the first and second impurity regions 130a and 130b. The first and second source body regions 112a and 112b, the first through third gate electrodes 118a, 118b, and 118c, and the impurity region 130 including the first and second impurity regions 130a and 130b may be repeatedly arranged in an X direction.

The first source body region 112a may be arranged in the Y direction as a pattern having a bar shape. The first source body contact region 116a and the first source region 114a may be arranged in contact with each other in the first source body region 112a. The first source body contact region 116a and the first source region 114a may be arranged in the Y direction as a pattern having a bar shape.

The first gate electrode 118a may be arranged in contact with the first source region 114a. The first gate electrode 118a may be arranged in the Y direction as a pattern having a bar shape. The third gate electrode 118c may be arranged to be apart from the first gate electrode 118a in the X direction. The third gate electrode 118c may be arranged in the Y direction as a pattern having a bar shape.

The first impurity region 130a may be arranged between the first gate electrode 118a and the third gate electrode 118c. The second gate electrode 118b may be arranged to be apart from the third gate electrode 118c in the X direction. The second gate electrode 118b may be arranged in the Y direction as a pattern having a bar shape. The second impurity region 130b may be arranged between the third gate electrode 118c and the second gate electrode 118b.

The second source body region 112b may be arranged in contact with the second gate electrode 118b. The second source body region 112b may be arranged in the Y direction as a pattern having a bar shape. The second source region 114b and the second source body contact region 116b may be arranged in contact with each other in the second source body region 112b. The second source region 114b and the second source body contact region 116b may be arranged in the Y direction as a pattern having a bar shape.

Figure 3:
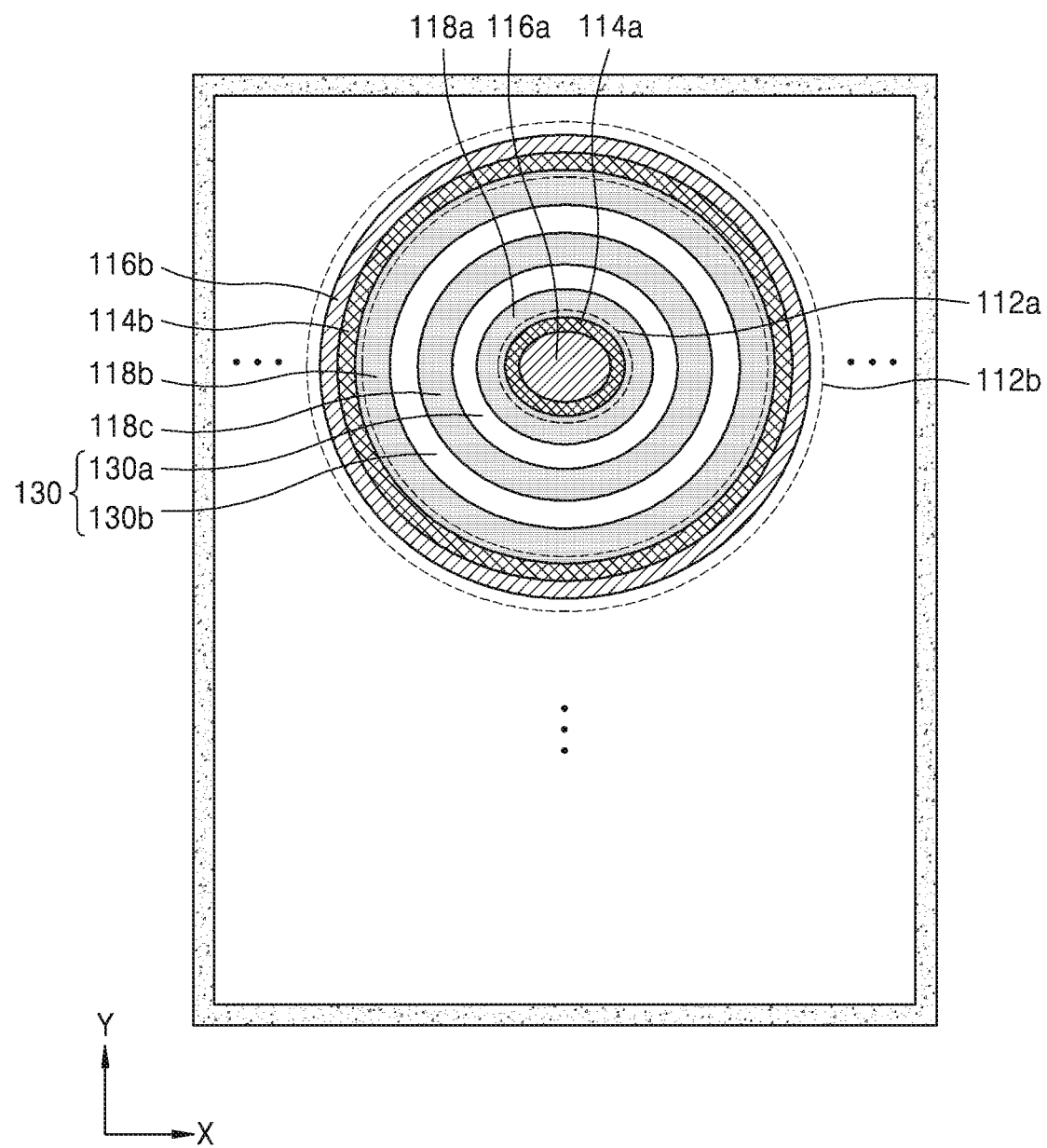
FIG. 3 is a view showing a planar layout of the power device of FIG. 1, according to an example embodiment.

FIG. 3 is a view showing a planar layout of the power device 10 of FIG. 1, according to an example embodiment.

In detail, FIG. 3 is the planar layout of some components of the power device 10 of FIG. 1. The planar layout of FIG. 3 may be the same as the planar layout of FIG. 2 except that the components of the power device 10 are formed as a pattern having a circular shape.

The power device 10 may include the first and second source body regions 112a and 112b, the first through third gate electrodes 118a, 118b, and 118c, and the impurity region 130 including the first and second impurity regions 130a and 130b. The first and second source body regions 112a and 112b, the first through third gate electrodes 118a, 118b, and 118c, and the impurity region 130 including the first and second impurity regions 130a and 130b may be repeatedly arranged in an X direction and a Y direction.

The first source body region 112a may be arranged as a pattern having a circular shape. The first source body contact region 116a and the first source region 114a may be arranged in contact with each other in the first source body region 112a. The first source body contact region 116a and the first source region 114a may be arranged as a pattern having a circular shape.

The first gate electrode 118a may be arranged to contact an outer side of the first source region 114a. The first gate electrode 118a may be arranged as a pattern having a circular shape. The third gate electrode 118c may be arranged to be apart from an outer side of the first gate electrode 118a. The third gate electrode 118c may be arranged as a pattern having a circular shape.

The first impurity region 130a may be arranged between the first gate electrode 118a and the third gate electrode 118c. The second gate electrode 118b may be arranged to be apart from an outer side of the third gate electrode 118c. The second gate electrode 118b may be arranged as a pattern having a circular shape. The second impurity region 130b may be arranged between the third gate electrode 118c and the second gate electrode 118b.

The second source body region 112b may be arranged to contact an outer side of the second gate electrode 118b. The second source body region 112b may be arranged as a pattern having a circular shape. The second source region 114b and the second source body contact region 116b may be arranged to contact with each other in the second source body region 112b. The second source region 114b and the second source body contact region 116b may be arranged as a pattern having a circular shape.

In FIG. 3 above, each component is formed as the pattern having the circular shape. However, example embodiments are not limited thereto. For example, each component may be formed as a pattern having a polygonal shape, for example, a hexagonal shape.

FIGS. 4 through 7 are views for describing a gate length, a breakdown voltage characteristic, and a specific on resistance characteristic of the power device 10 of FIG. 1.

Figure 4:
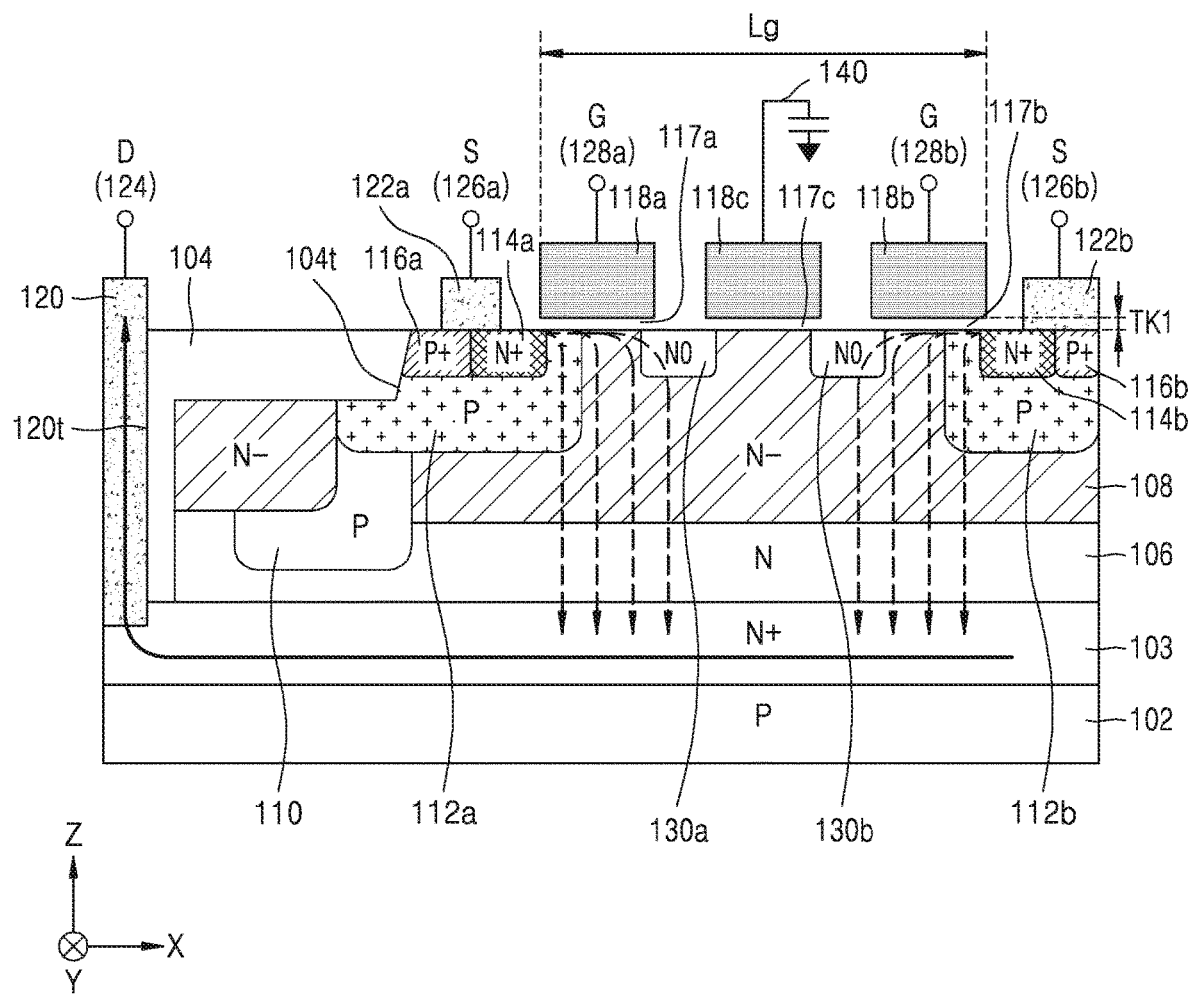
FIGS. 4 through 7 are views for describing a gate length, a breakdown voltage characteristic, and a specific on resistance characteristic of the power device of FIG. 1.

In detail, FIG. 4 is a cross-sectional view of the power device 10. In FIG. 4, like reference numerals refer to the like elements in FIG. 1. In FIG. 4, aspects that are the same as those of FIG. 1 will not be described or will be briefly described. When the power device 10 is turned on, as indicated by arrows, carriers, for example, electrons, from the first and second source regions 114a and 114b, may move to the buried layer 103 included in the drain region, through the drift layer 108. The carriers having moved to the buried layer 103 may move to the drain terminal D (124) through the drain electrode 120. Thus, currents may flow from the drain terminal D (124) to the first and second source terminals S (126a) and S (126b).

Figure 5:
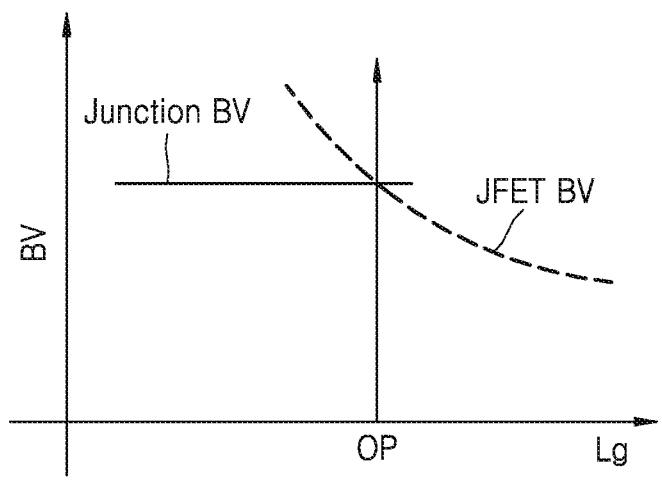

FIG. 5 is a graph showing a breakdown voltage BV based on a gate length Lg of the power device 10. As illustrated in FIG. 5, the breakdown voltage BV of the power device 10 may be divided into a junction breakdown voltage Junction BV and a junction electric field breakdown voltage JFET BV.

The junction breakdown voltage Junction BV may be a breakdown voltage between the first and second source body regions 112a and 112b and the drift layer 108. The junction electric field breakdown voltage JFET BV may be a breakdown voltage between the first source body region 112a and the second source body region 112b.

As illustrated in FIG. 5, the junction breakdown voltage Junction BV may have a constant value based on the gate length Lg, when an impurity doping concentration of the first and second source body regions 112a and 112b and the drift layer 108 is determined. The junction electric field breakdown voltage JFET BV may be reduced as the gate length Lg is increased. Thus, the breakdown voltage BV of the power device 10 may have an optimal gate length Lg at an optimal point OP.

Figure 6:
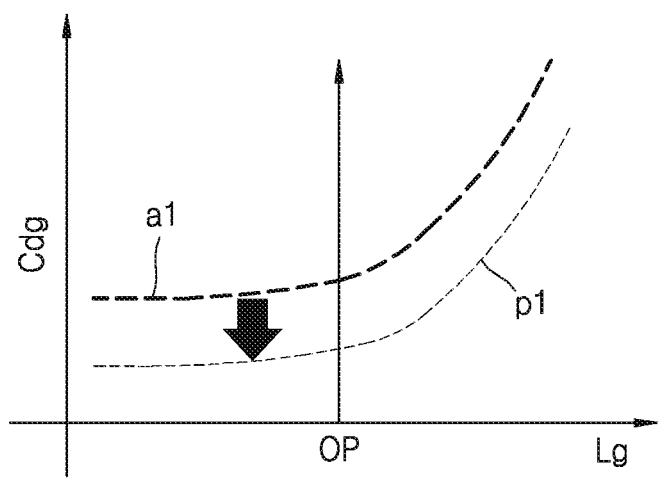

FIG. 6 is a graph for describing a parasitic capacitance Cdg between the drain electrode 120 and the first through third gate electrodes 118a, 118b, and 118c based on the gate length Lg of the power device 10. The parasitic capacitance Cdg may be increased as the gate length Lg is increased. Reference numeral a1 indicates a comparative example in which the gate electrode of FIG. 4 is integrally formed rather than being separately formed, and reference numeral p1 indicates a case of example embodiments of the inventive concepts, where the gate electrode is separated into the first through third gate electrodes 118a, 118b, and 118c, as illustrated in FIG. 4.

As illustrated in FIG. 6, the case p1 in which the gate electrode is separated into the first through third gate electrodes 118a, 118b, and 118c at the optimal point OP of the gate length Lg, pre-determined in FIG. 5, has a lower parasitic capacitance Cdg between the drain electrode 120 and the first through third gate electrodes 118a, 118b, and 118c, than the case a1 in which the gate electrode is not separated into the first through third gate electrodes 118a, 118b, and 118c at the optimal point OP of the gate length Lg.

Figure 7:
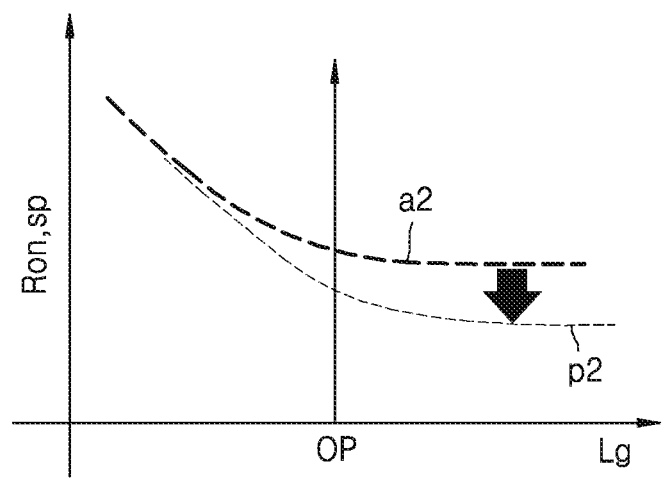

FIG. 7 is a graph for describing a specific on resistance Ron, sp based on the gate length Lg of the power device 10. The specific on resistance Ron, sp may be decreased as the gate length Lg is increased. Reference numeral a2 indicates a comparative example in which the gate electrode is integrally formed rather than being separately formed, and reference numeral p2 indicates a case as illustrated in FIG. 4, where the gate electrode is separated into the first through third gate electrodes 118a, 118b, and 118c.

As illustrated in FIG. 7, it is shown that the case p2 in which the gate electrode is separated into the first through third gate electrodes 118a, 118b, and 118c at the optimal point OP of the gate length Lg, predetermined in FIG. 5, has a lower specific on resistance Ron, sp than the case a2 in which the gate electrode is not separated into the first through third gate electrodes 118a, 118b, and 118c at the optimal point OP of the gate length Lg. Accordingly, the power device 10 may improve the flow of carriers, for example, electrons, moving through the drift layer 108 in a vertical direction (a Z direction), thereby improving driving currents.

Figure 8:
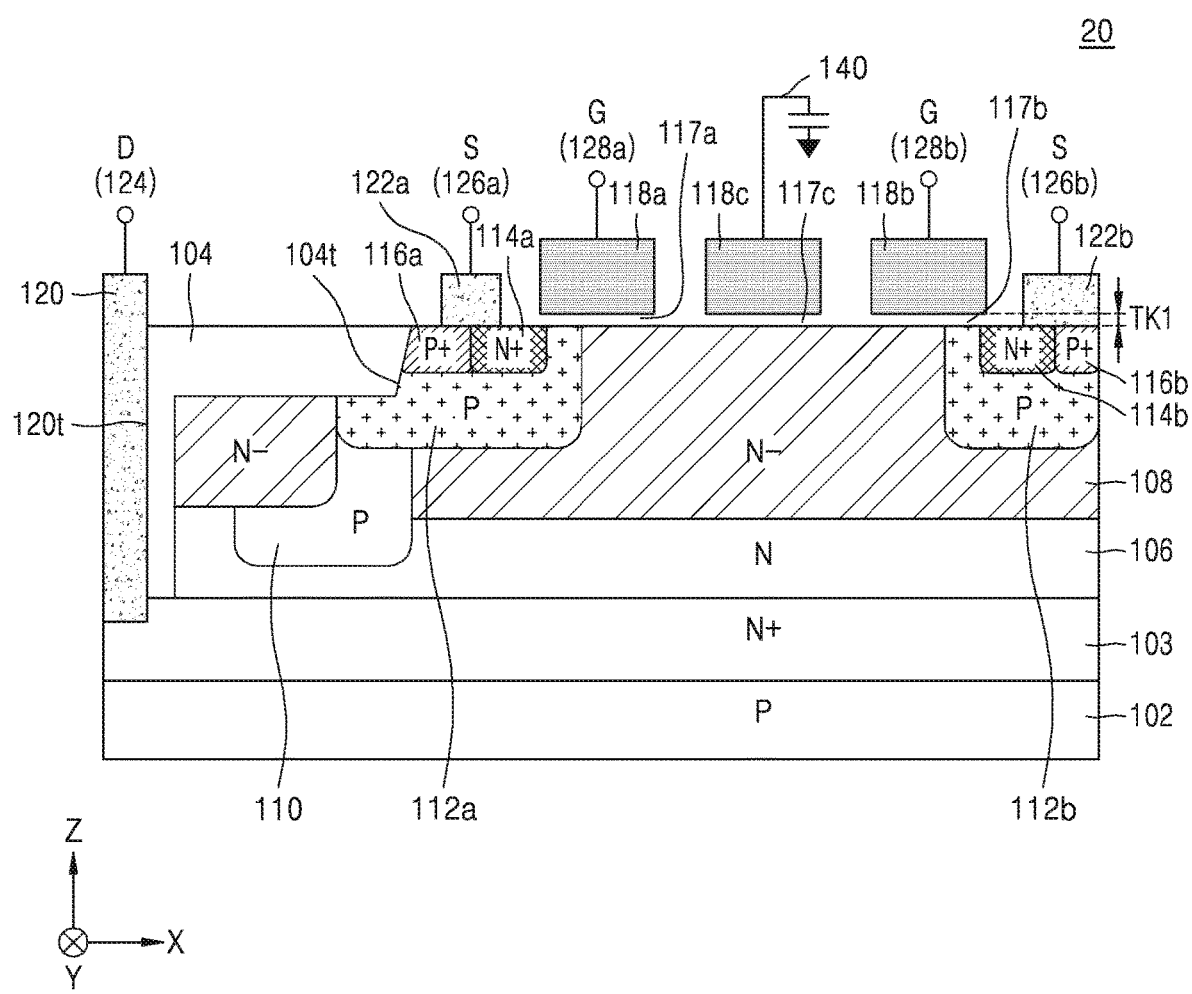
FIG. 8 is a cross-sectional view of a power device according to another example embodiment of the inventive concepts.

FIG. 8 is a cross-sectional view for describing a power device 20 according to another example embodiment of the inventive concepts.

In detail, the power device 20 may be the same as the power device 10 of FIG. 1, except that the first and second impurity regions 130a and 130b are not formed in the power device 20. In FIG. 8, like reference numerals refer to the like elements in FIG. 1. In FIG. 8, aspects that are the same as those of FIG. 1 will not be described or will be briefly described.

The power device 20 may have a structure in which the drain electrode 120 filled in the deep trench 120t penetrating the trench device isolation layer 104 is connected to the buried layer 103, that is, the drain region, and thus, may be easily implemented in a BCD process. Also, the power device 20 may obtain a required breakdown voltage by adjusting a vertical thickness (a thickness in a Z direction) of the epitaxial layer 106 on the semiconductor layer 102 without increasing a horizontal area (an area of an X-Y plane) of the epitaxial layer 106.

Further, the power device 20 may separate the gate electrode into a plurality of gate electrodes, for example, the first through third gate electrodes 118a, 118b, and 118c, and thus, a parasitic capacitance Cdg between the drain electrode 120 and the first through third gate electrodes 118a, 118b, and 118c, a parasitic capacitance Cds between the drain electrode 120 and the first and second source electrodes 122a and 122b, and a specific on resistance of the drift layer 108 may be decreased. Accordingly, the power device 20 may improve the flow of carriers, for example, electrons, moving through the drift layer 108 in the vertical direction (the Z direction), thereby improving the driving currents.

Figure 9:
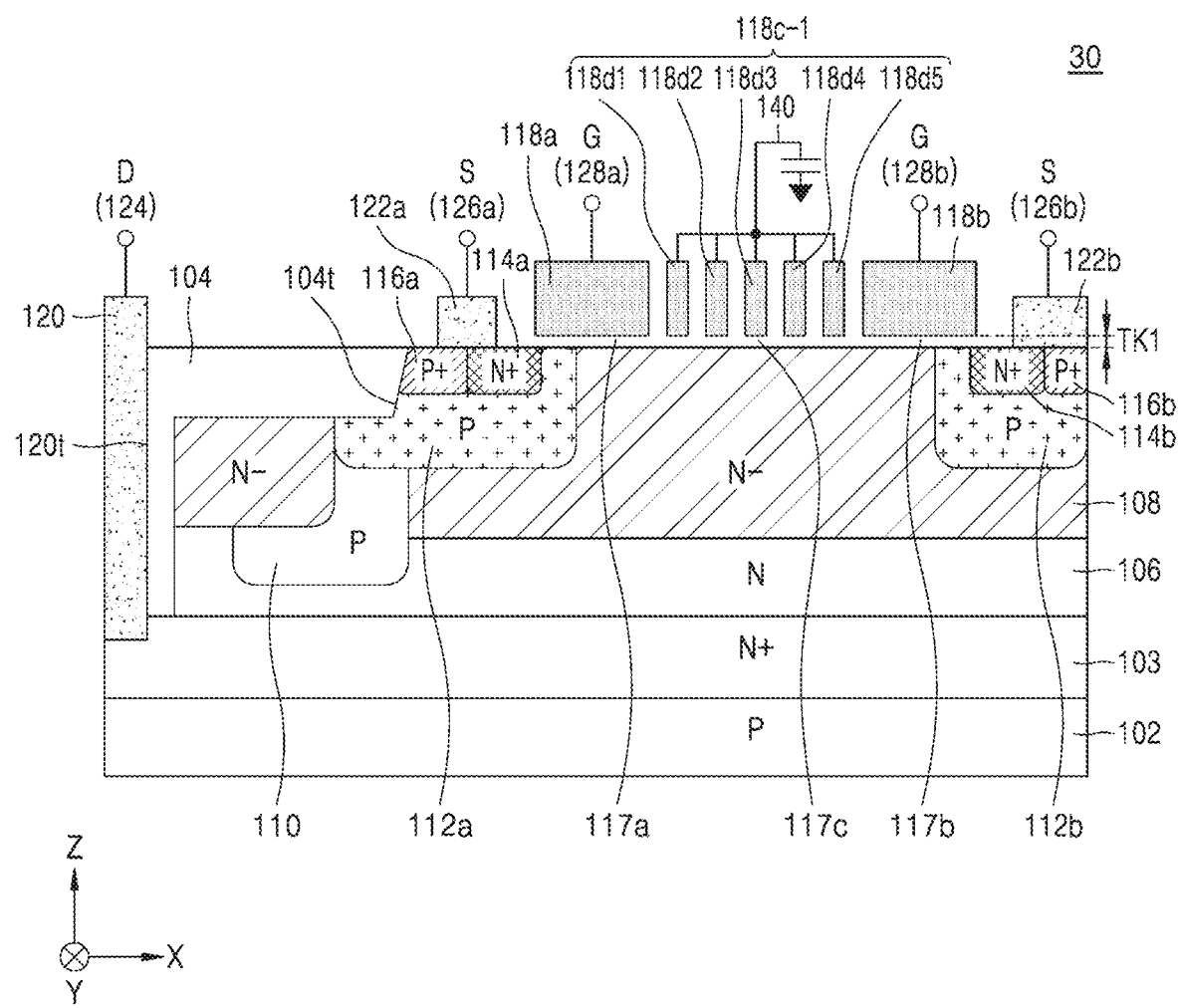
FIG. 9 is a cross-sectional view of a power device according to another example embodiment of the inventive concepts.

FIG. 9 is a cross-sectional view for describing a power device 30 according to another example embodiment of the inventive concepts.

In detail, the power device 30 may be the same as the power device 10 of FIG. 1, except that the power device 30 includes a third gate electrode 118c-1 including sub-gate electrodes 118d1 through 118d5 and the power device 30 does not include the first and second impurity regions 130a and 130b. In FIG. 9, like reference numerals refer to the like elements in FIG. 1. In FIG. 9, aspects that are the same as those of FIG. 1 will not be described or will be briefly described.

The power device 30 may separate the gate electrode into a plurality of gate electrodes, for example, the first through third gate electrodes 118a, 118b, and 118c-1, and thus, a parasitic capacitance Cdg between the drain electrode 120 and the first through third gate electrodes 118a, 118b, and 118c-1, a parasitic capacitance Cds between the drain electrode 120 and the first and second source electrodes 122a and 122b, and a specific on resistance of the drift layer 108 may be decreased.

In the power device 30, the third gate electrode 118c-1 may include sub-gate electrodes 118d1 through 118d5 apart from one another and the sub-gate electrodes 118d1 through 118d5 may be floated. Accordingly, the parasitic capacitance Cdg between the drain electrode 120 and the first through third gate electrodes 118a, 118b, and 118c-1, the parasitic capacitance Cds between the drain electrode 120 and the first and second source electrodes 122a and 122b, and the specific on resistance of the drift layer 108 may be further decreased.

Further, the power device 30 may adjust a horizontal electric field (an electric field in an X direction) between the first source region 114a and the second source region 114b to adjust the flow of carriers, for example, electrons, moving through the drift layer 108 in a vertical direction (a Z direction), thereby adjusting driving currents.

Figure 10:
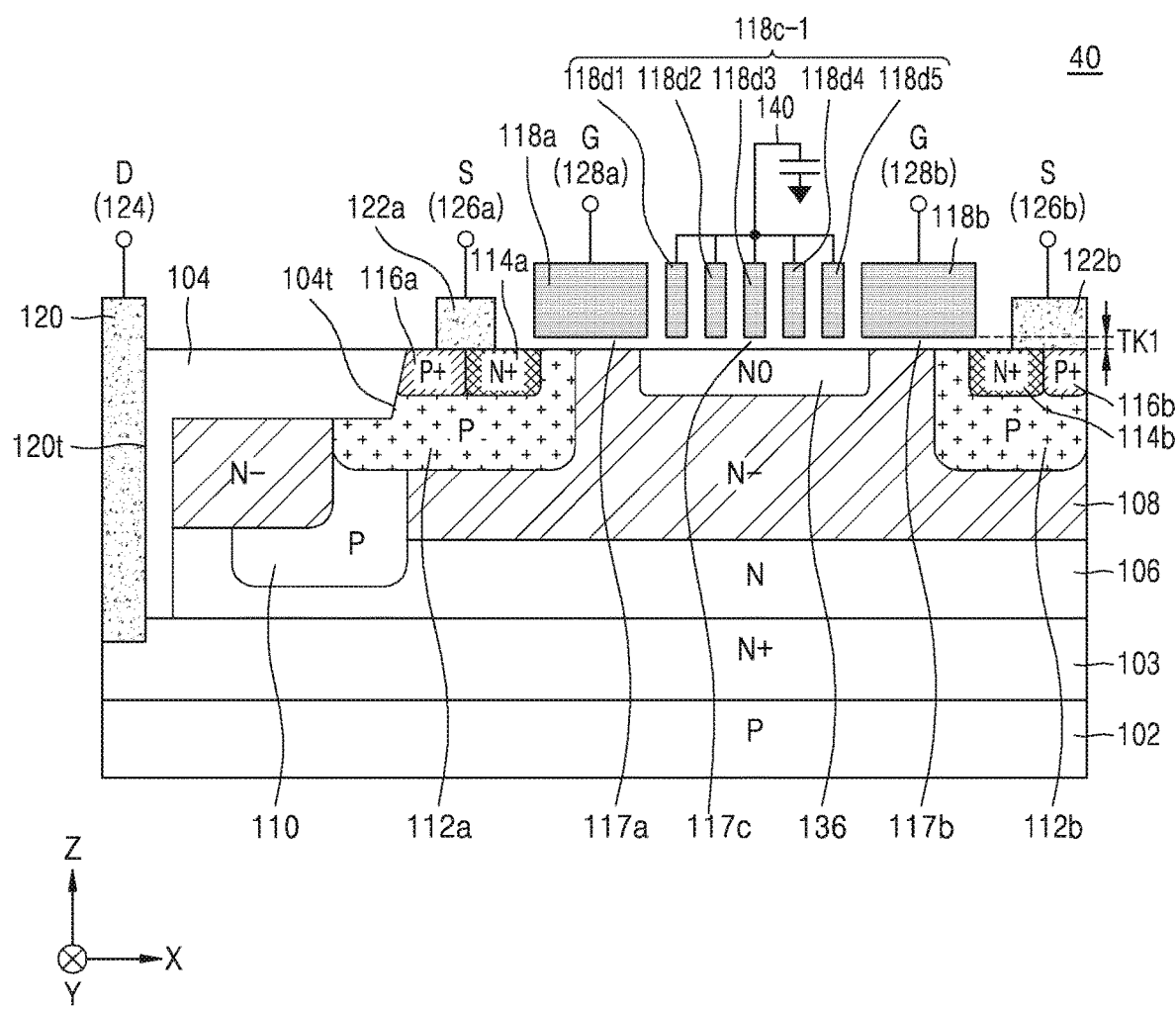
FIG. 10 is a cross-sectional view of a power device according to another example embodiment of the inventive concepts.

FIG. 10 is a cross-sectional view of a power device 40 according to another example embodiment of the inventive concepts.

In detail, the power device 40 may be the same as the power device 10 of FIG. 1, except that the power device 40 includes the third gate electrode 118c-1 including the sub-gate electrodes 118d1 through 118d5.

The power device 40 may be the same as the power device 30 of FIG. 9, except that the power device 40 includes a third impurity region 136. In FIG. 10, like reference numerals refer to the like elements in FIGS. 1 and 9. In FIG. 10, aspects that are the same as those of FIGS. 1 and 9 will not be described or will be briefly described.

The power device 40 may separate the gate electrode into a plurality of gate electrodes, for example, the first through third gate electrodes 118a, 118b, and 118c-1, and thus, a parasitic capacitance Cdg between the drain electrode 120 and the first through third gate electrodes 118a, 118b, and 118c-1, a parasitic capacitance Cds between the drain electrode 120 and the first and second source electrodes 122a and 122b, and a specific on resistance of the drift layer 108 may be decreased.

In the power device 40, the third gate electrode 118c-1 may include the sub-gate electrodes 118d1 through 118d5 apart from one another and the sub-gate electrodes 118d1 through 118d5 may be floated. Accordingly, the power device 40 may adjust the parasitic capacitance Cdg between the drain electrode 120 and the first through third gate electrodes 118a, 118b, and 118c-1, the parasitic capacitance Cds between the drain electrode 120 and the first and second source electrodes 122a and 122b, and the specific on resistance of the drift layer 108 to be low.

Further, in the power device 40, the third impurity region 136 of a second conductivity type may be formed on an upper surface of the drift layer 108 below the third gate electrode 118c-1, in a higher concentration than the drift layer 108. The third impurity region 136 may be an NO impurity region.

The third impurity region 136 may be a region doped with n-type impurities, for example, P, in a concentration of $10E18/cm^3$. The third impurity region 136 may formed by injecting the n-type impurities by using an ion injection method. The power device 40 may reduce the specific on resistance of the drift layer 108 by including the third impurity region 136, thereby improving driving currents.

Figure 11:
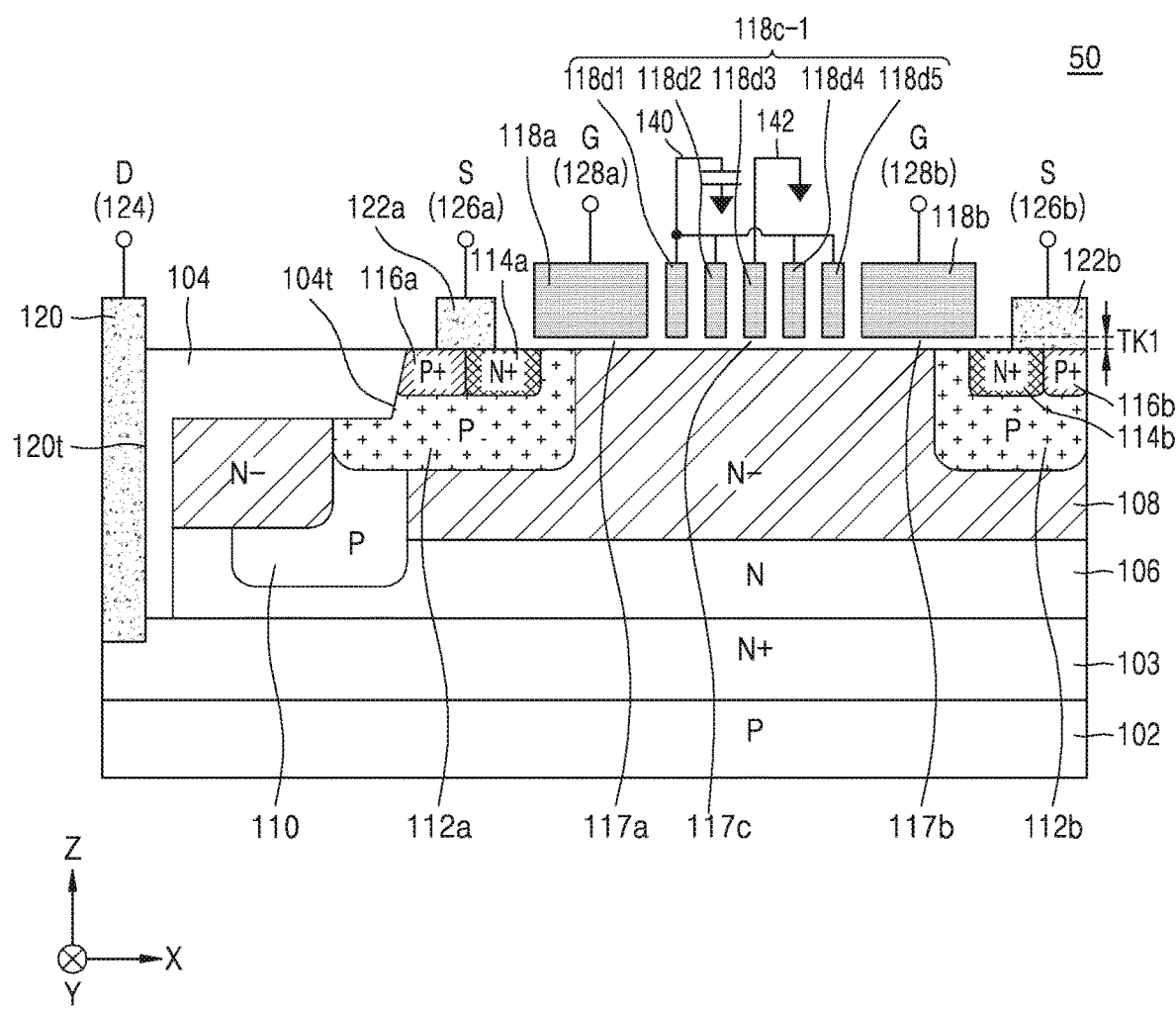
FIG. 11 is a cross-sectional view of a power device according to another example embodiment of the inventive concepts.

FIG. 11 is a cross-sectional view of a power device 50 according to another example embodiment of the inventive concepts.

In detail, the power device 50 may be the same as the power device 10 of FIG. 1, except that the power device 50 includes the third gate electrode 118c-1 including the sub-gate electrodes 118d1 through 118d5.

The power device 50 may be the same as the power device 30 of FIG. 9, except that in the power device 50, the sub-gate electrode 118d3 at the center of the sub-gate electrodes 118d1 through 118d5 is connected to a ground line 142 to be grounded. In FIG. 11, like reference numerals refer to the like elements in FIGS. 1 and 9. In FIG. 11, aspects that are the same as those of FIGS. 1 and 9 will not be described or will be briefly described.

The power device 50 may separate the gate electrode into a plurality of gate electrodes, for example, the first through third gate electrodes 118a, 118b, and 118c-1, and thus, a parasitic capacitance Cdg between the drain electrode 120 and the gate electrodes 118a, 118b, and 118c-1, a parasitic capacitance Cds between the drain electrode 120 and the first and second source electrodes 122a and 122b, and a specific on resistance of the drift layer 108 may be reduced.

In the power device 50, the third gate electrode 118c-1 may include the sub-gate electrodes 118d1 through 118d5 apart from one another, and the sub-gate electrode 118d3 at the center of the sub-gate electrodes 118d1 through 118d5 may be connected to the ground line 142 to be grounded and the other sub-gate electrodes 118d1, 118d2, 118d4, and 118d5 may be connected to a floating line 140 to be floated.

Accordingly, the power device 50 may adjust a horizontal electric field (an electric field in an X direction) between the first source region 114a and the second source region 114b to adjust the flow of carriers, for example, electrons, moving through the drift layer 108 in a vertical direction (a Z direction), thereby adjusting driving currents.

Figure 12:
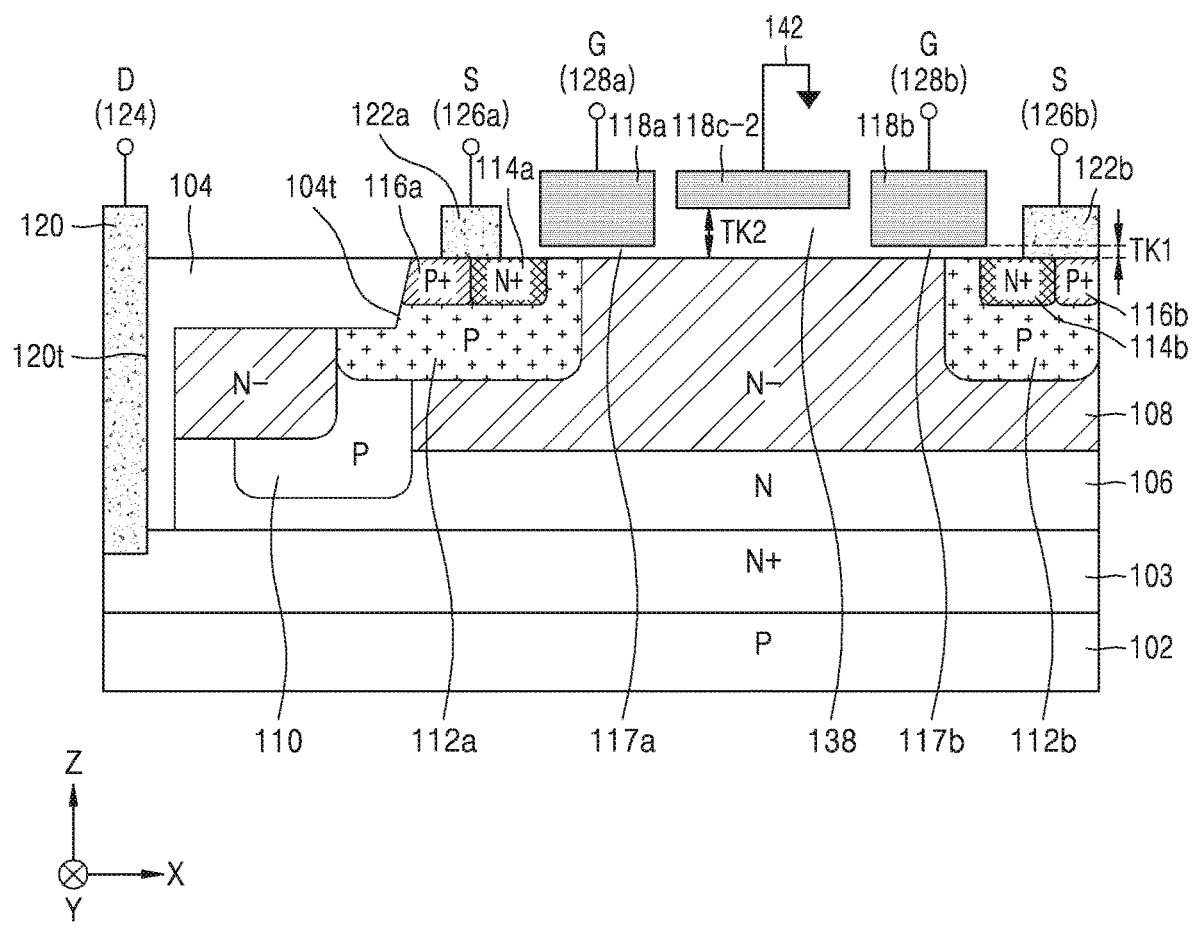
FIG. 12 is a cross-sectional view of a power device according to another example embodiment of the inventive concepts.

FIG. 12 is a cross-sectional view of a power device 60 according to another example embodiment of the inventive concepts.

In detail, the power device 60 may be the same as the power device 10 of FIG. 1, except that in the power device 60, a thickness TK2 of the third gate insulating layer 138 is greater than a thickness TK1 of the first and second gate insulating layers 117a and 117b, and a third gate electrode 118c-2 is connected to the ground line 142 to be grounded. In FIG. 12, like reference numerals refer to the like elements in FIG. 1. In FIG. 12, aspects that are the same as those of FIG. 1 will not be described or will be briefly described.

The power device 60 may separate the gate electrode to a plurality of gate electrodes, for example, the first through third gate electrodes 118a, 118b, and 118c-2, and thus, a parasitic capacitance Cdg between the drain electrode 120 and the first through third gate electrodes 118a, 118b, and 118c-2, a parasitic capacitance Cds between the drain electrode 120 and the first and second source electrodes 122a and 122b, and a specific on resistance of the drift layer 108 may be reduced.

In addition, the thickness TK2 of the third gate insulating layer 138 may be greater than the thickness TK1 of the first and second gate insulating layers 117a and 117b and the third gate electrode 118c-2 may be formed to have a less thickness, to further decrease the parasitic capacitance Cdg between the drain electrode 120 and the first through third gate electrodes 118a, 118b, and 118c-1, so that driving currents may be improved.

Figure 13:
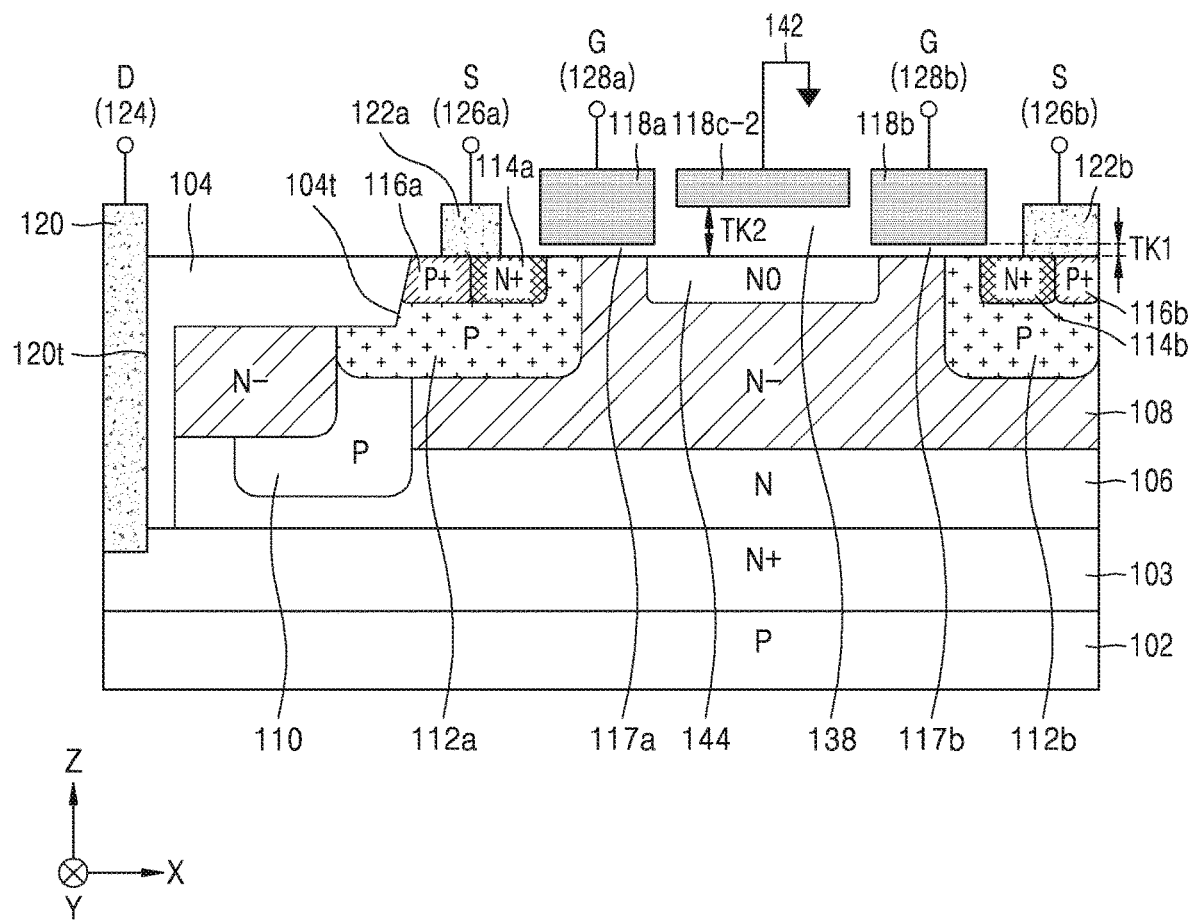
FIG. 13 is a cross-sectional view of a power device according to another example embodiment of the inventive concepts.

FIG. 13 is a cross-sectional view of a power device 70 according to another example embodiment of the inventive concepts.

In detail, the power device 70 may be the same as the power device 10 of FIG. 1, except that in the power device 70, the thickness TK2 of the third gate insulating layer 138 is greater than the thickness TK1 of the first and second gate insulating layers 117a and 117b and the third gate electrode 118c-2 is grounded. The power device 70 may be the same as the power device 60 of FIG. 12, except that the power device 70 includes a fourth impurity region 144. In FIG. 13, like reference numerals refer to the like elements in FIGS. 1 and 12. In FIG. 13, aspects that are the same as those of FIGS. 1 and 12 will not be described or will be briefly described.

The power device 70 may separate the gate electrode into a plurality of gate electrodes, for example, the first through third gate electrodes 118a, 118b, and 118c-2, and thus, a parasitic capacitance Cdg between the drain electrode 120 and the first through third gate electrodes 118a, 118b, and 118c-2, a parasitic capacitance Cds between the drain electrode 120 and the first and second source electrodes 122a and 122b, and a specific on resistance of the drift layer 108 may be reduced.

In the power device 70, the third gate insulating layer 138 may have a great thickness TK2 and the third gate electrode 118c-2 may have a less thickness, to further reduce the parasitic capacitance Cdg between the drain electrode 120 and the first through third gate electrodes 118a, 118b, and 118c-2, so that driving currents may be improved.

Further, the power device 70 may include the fourth impurity region 144 of a second conductivity type on an upper surface of the drift layer 108 below the third gate electrode 118c-2, the fourth impurity region 144 being formed in a higher concentration than the drift layer 108. The fourth impurity region 144 may be an NO impurity region.

The fourth impurity region 144 may be a region doped with n-type impurities, for example, P, in a concentration of $10E18/cm^3$. The third impurity region 136 may be formed by injecting n-type impurities by using an ion injection method. The power device 70 may reduce a specific on resistance of the drift layer 108 by including the fourth impurity region 144, thereby improving driving currents.

Figure 14:
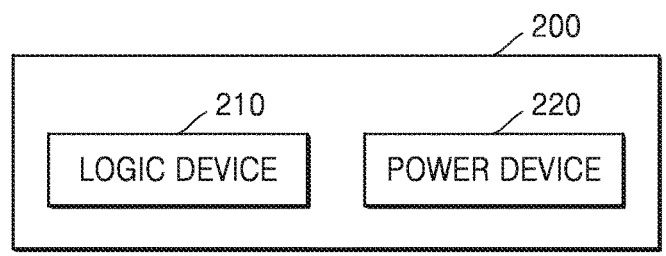
FIG. 14 is a cross-sectional view of an electronic device including a power device according to the inventive concept.

FIG. 14 is a block diagram of an electronic device 200 including a power device 220 according to the inventive concept.

In detail, the electronic device 200 may include a logic device 210 and the power device 220. The electronic device 200 may be an integrated circuit device integrated onto a substrate. The logic device 210 may include a bipolar transistor and a CMOS transistor. The logic device 210 may include a low voltage transistor.

The power device 220 may include the power devices 10 through 70 according to the embodiments. The power device 220 may include a VDMOS transistor. The power device 220 may include a high voltage transistor.

The bipolar transistor may include a high speed logic circuit and an analog circuit. The CMOS transistor may include a digital logic circuit. The DMOS transistor may include an output driving circuit.

While example embodiments of the inventive concepts have been particularly shown and described with reference to some example embodiments thereof, it will be understood that various changes in form and details may be made therein without departing from the spirit and scope of the following claims.

What is claimed is:

1. A power device comprising:
   a semiconductor layer of a first conductivity type;
   a drift layer of a second conductivity type on the semiconductor layer;
   a plurality of source regions on the drift layer, the plurality of source regions including a first source region and a second source region apart from the first source region on the drift layer, the first source region and the second source region each of the second conductivity type; and
   a plurality of gate electrodes between the first source region and the second source region and apart from the drift layer by a gate insulating layer, the plurality of gate electrodes including a first gate electrode, a second gate electrode and a third gate electrode, the first gate electrode adjacent to the first source region, the second gate electrode adjacent to the second source region, and the third gate electrode between the first and second gate electrodes, the third gate electrode being floated or grounded.

2. The power device of claim 1, wherein the power device further comprises:
   an impurity region on an upper surface of the drift layer between at least two of the plurality of gate electrodes, the impurity region and the drift layer each of the second conductivity type such that the impurity region has a higher impurity concentration than the drift layer.

3. The power device of claim 1, further comprising:
   a plurality of source body regions in the drift layer, the plurality of source body regions of the first conductivity type and including a first source body region and a second source body region surrounding bottom portions of the first source region and the second source region, respectively.

4. The power device of claim 3, further comprising:
a first channel region in the first source body region such that the first channel region is below the first gate electrode and adjacent to the first source region; and
a second channel region in the second source body region such that the second channel region is below the second gate electrode and adjacent to the second source region.

5. The power device of claim 3, further comprising:
a plurality of source body contact regions, the plurality of source body contact regions of the first conductivity type and including a first source body contact region and a second source body contact region, the first source body contact region in the first source body region adjacent to the first source region, and the second source body contact region in the second source body region adjacent to the second source region.

6. The power device of claim 1, further comprising:
a buried layer below the drift layer such that the buried layer is in a drain region, the buried layer of the second conductivity type.

7. The power device of claim 6, further comprising:
a trench device isolation layer defining the drift layer; and
a drain electrode penetrating the trench device isolation layer such that the drain electrode is electrically connected to the buried layer.

8. The power device of claim 1, wherein the third gate electrode comprises:
a plurality of sub-gate electrodes apart from one another, the plurality of sub-gate electrodes each floated or grounded.

9. The power device of claim 8, further comprising:
an impurity region on an upper surface of the drift layer below the plurality of sub-gate electrodes, the impurity region and the drift layer each of the second conductivity type such that the impurity region has a higher impurity concentration than the drift layer.

10. The power device of claim 1, wherein the gate insulating layer comprises:
a first gate insulating layer below the first gate electrode;
a second gate insulating layer below the second gate electrode; and
a third gate insulating layer below the third gate electrode, wherein
a thickness of the third gate insulating layer is greater than a thickness of the first gate insulating layer and greater than a thickness of the second gate insulating layer.

11. The power device of claim 10, further comprising:
an impurity region on an upper surface of the drift layer below the third gate insulating layer, the impurity region and the drift layer each of the second conductivity type such that the impurity region has a higher impurity concentration than the drift layer.

12. The power device of claim 1, wherein
the first gate electrode and the second gate electrode are over a first side and a second side of the drift layer, respectively, and
the third gate electrode is over a central portion of the drift layer.

13. The power device of claim 1, wherein the first gate electrode, the third gate electrode, and the second gate electrode are arranged in order in a bar shape or a circular shape.

14. A power device comprising:
a semiconductor layer of a first conductivity type;
a buried layer of a second conductivity type on the semiconductor layer, the buried layer included in a drain region of the power device;
a drift layer of the second conductivity type on the buried layer, the drift layer defined by a trench device isolation layer;
a drain electrode penetrating the trench device isolation layer such that the drain electrode is connected to the buried layer;
a plurality of source body regions in the drift layer, the plurality of source body regions of the first conductivity type and including a first source body region and a second source body region apart from the first source body region;
a plurality of source regions on respective ones of the plurality of source body regions, the plurality of source regions of the second conductivity type and including a first source region and a second source region on surfaces of the first source body region and the second source body region, respectively;
a plurality of source electrodes including a first source electrode and a second source electrode on the first source region and the second source region, respectively; and
a plurality of gate electrodes between the first source region and the second source region and apart from the drift layer by a gate insulating layer, the plurality of gate electrodes including a first gate electrode, a second gate electrode and a third gate electrode, the first gate electrode and the second gate electrode over a first side and a second side of the drift layer, respectively, and the third gate electrode over a central portion of the drift layer, the third gate electrode being floated or grounded.

15. The power device of claim 14, further comprising:
an impurity region on an upper surface of the drift layer between at least two of the plurality of gate electrodes, the impurity region and the drift layer each of the second conductivity type such that the impurity region has a higher impurity concentration than the drift layer.

16. The power device of claim 14, further comprising:
a plurality of source body contact regions, the plurality of source body contact regions of the first conductivity type and including a first source body contact region and a second source body contact region, the first source body contact region in the first source body region adjacent to the first source region such that the first source body contact region is connected to the first source electrode and the second source body contact region in the second source body region adjacent to the second source region such that the second source body contact region is connected to the second source electrode.

17. The power device of claim 14, further comprising:
a first channel region in the first source body region such that the first channel region is below the first gate electrode and adjacent to the first source region; and
a second channel region in the second source body region such that the second channel region is below the second gate electrode and adjacent to the second source region.

18. The power device of claim 14, wherein the gate insulating layer comprises:
a first gate insulating layer below the first gate electrode;
a second gate insulating layer below the second gate electrode; and
a third gate insulating layer below the third gate electrode, wherein a thickness of the third gate insulating layer is greater than a thickness of the first gate insulating layer and greater than a thickness of the second gate insulating layer.

19. A power device comprising:

a semiconductor layer of a first conductivity type;

a buried layer of a second conductivity type located on the semiconductor layer, the buried layer included in a drain region of the power device;

a drift layer of the second conductivity type on the buried layer, the drift layer defined by a trench device isolation layer;

a drain electrode penetrating the trench device isolation layer such that the drain electrode is connected to the buried layer;

a plurality of source body regions in the drift layer, the plurality of source body regions of the first conductivity type and including a first source body region and a second source body region apart from the first source body region;

a plurality of source regions on respective ones of the plurality of source body regions, the plurality of source regions of the second conductivity type and including a first source region and a second source region on surfaces of the first source body region and the second source body region, respectively;

a plurality of source electrodes including a first source electrode and a second source electrode on the first source region and the second source region, respectively; and a plurality of gate electrodes between the first source region and the second source region and apart from the drift layer by a gate insulating layer, the plurality of gate electrodes including a first gate electrode, a second gate electrode, and a third gate electrode, the first gate electrode and the second gate electrode adjacent to the first source region and the second source region, respectively, and the third gate electrode between the first gate electrode and the second gate electrode, the third gate electrode including a plurality of sub-gate electrodes apart from one another, the plurality of sub-gate electrodes being floated or grounded.

20. The power device of claim 19, further comprising:

an impurity region on the drift layer below the plurality of sub-gate electrodes, the impurity region and the drift layer each of the second conductivity type such that the impurity region has a higher impurity concentration than the drift layer.

\* \* \* \* \*